(12) United States Patent
Garner

(10) Patent No.: US 7,698,815 B2
(45) Date of Patent: Apr. 20, 2010

(54) METHOD FOR FORMING A HEAT DISSIPATION DEVICE

(75) Inventor: Scott Garner, Lititz, PA (US)

(73) Assignee: Thermal Corp., Stanton, DE (US)

( * ) Notice: Subject to any disclaimer, the term of this patent is extended or adjusted under 35 U.S.C. 154(b) by 1011 days.

(21) Appl. No.: 10/817,170

(22) Filed: Apr. 2, 2004

(65) Prior Publication Data

US 2004/0201963 A1    Oct. 14, 2004

Related U.S. Application Data

(63) Continuation-in-part of application No. 10/413,601, filed on Apr. 14, 2003, now Pat. No. 6,717,813.

(51) Int. Cl.
   *B23P 15/26* (2006.01)
   *B21D 53/08* (2006.01)

(52) U.S. Cl. ............... 29/890.04; 29/890.045; 29/890.046; 29/890.038; 29/890.032; 361/700

(58) Field of Classification Search ............ 29/890.032, 29/890.038, 890.04, 890.045, 890.046; 361/700–703; 257/E23.088
   See application file for complete search history.

(56) References Cited

U.S. PATENT DOCUMENTS

| | | | |
|---|---|---|---|
| 1,787,942 A * | 1/1931 | Kalloch, Jr. ............... | 165/181 |
| 2,462,511 A | 2/1949 | Kramer | |
| 3,780,797 A | 12/1973 | Gebelius | |
| 4,204,246 A | 5/1980 | Aril et al. | |
| 4,492,851 A | 1/1985 | Carr | |
| 4,833,567 A | 5/1989 | Saaski et al. | |
| 4,966,226 A | 10/1990 | Hamburgen | |
| 5,181,167 A | 1/1993 | Davidson et al. | |
| 5,268,812 A | 12/1993 | Conte | |
| 5,329,993 A | 7/1994 | Ettehadieh | |
| 5,355,942 A | 10/1994 | Conte | |
| 6,075,287 A | 6/2000 | Ingraham et al. | |
| 6,102,110 A | 8/2000 | Julien et al. | |
| 6,163,073 A | 12/2000 | Patel | |
| 6,313,994 B1 | 11/2001 | Tantoush | |
| 6,366,460 B1 | 4/2002 | Stone et al. | |
| 6,382,306 B1 | 5/2002 | Hsu | |
| 6,394,175 B1 | 5/2002 | Chen et al. | |
| 6,550,529 B1 | 4/2003 | Horng et al. | |
| 6,853,555 B2 * | 2/2005 | Fichera et al. ............... | 361/700 |
| 2001/0001981 A1 | 5/2001 | Ueda et al. | |
| 2003/0218849 A1 | 11/2003 | Mochizuki et al. | |

* cited by examiner

*Primary Examiner*—David P Bryant
*Assistant Examiner*—Sarang Afzali
(74) *Attorney, Agent, or Firm*—Michael Best & Friedrich LLP

(57) ABSTRACT

A heat sink for integrated circuits is limited substantially to heat transfer fins on one or more heat pipe tubes, the tube(s) functioning as a base for the heat sink. The heat pipe tube has a flattened oval cross-section and can snap-fit in openings through the fins. The tube is exposed on one side of the heat sink for contact with the heat generating circuit. The fins can be flat or irregular and can have a collar engaging the heat pipe tube. In one example, the heat pipe runs perpendicular to vertical fins along the bottom of a standing fin stack. In another embodiment two U-shaped heat pipe tubes carry a layered stack, the bottom of the U-shapes being presented under the lowermost in the stack. A clamp urges the heat sink against the heat source.

9 Claims, 5 Drawing Sheets

METHOD FOR FORMING A HEAT DISSIPATION DEVICE

CROSS-REFERENCE TO RELATED APPLICATIONS

This is a Continuation-in-part Application of U.S. application Ser. No. 10/413,601, filed on Apr. 14, 2003 now U.S. Pat. No. 6,717,813.

FIELD OF THE INVENTION

The invention relates to heat exchangers, and in particular to a unit for dissipation of heat from a processor or other integrated circuit. One or more heat pipe tubes for thermally conductive contact with the circuit package extend along an edge of an array of parallel air convection fins. The heat pipe tube(s) are tapered toward a plane of contact with the circuit package, preferably having a flattened oval cross-section. This maximizes contact surface area on the heat pipe tubes and also provides a shape that structurally engages and supports the parallel fins on the heat pipe tubes. A clamping fixture arranged in the array of fins provides another structural member and a point for application of force to urge the heat pipe tubes into conductive contact with the circuit package.

BACKGROUND OF THE INVENTION

Various electrical semiconductor devices, such as large scale integrated circuits, voltage regulators, current switching devices, high speed or high current circuits and other similar devices, generate heat that can be deleterious to their own operation and must be dissipated. If the ambient air adjacent to the circuit is at a lower temperature than the circuit device, some heat energy is dissipated by heating of the ambient air. The relatively hot circuit device heats the relatively cooler air that comes into contact with the circuit device. The heated air is circulated by convection and replaced by cooler air, thus moving heat energy away from its source.

The rate of heat energy transfer frequently must be sufficient to keep the heat source below some specified limiting temperature. A number of techniques are used to facilitate movement and dissipation of thermal energy from a heat source. Some techniques rely on the nature of the heat sink, which could comprise a solid, liquid or gaseous medium. Other techniques rely on unique structural attributes. It is possible to use different mediums together. It is possible to vary the structural attributes to meet various objectives. Such objectives include the heat transfer rate, the thermal inertia of the sink, its size and weight, manufacturing and material costs, etc.

For dissipation of heat energy into the air, for example, maximizing the surface area of air contact is a consideration, often leading to heat sink structures with thin metal plates or fins for thermal conduction. Consideration also must be given to how the heat is coupled into the fins, often leading to solid metal base plate blocks for contact with the heat source, the base plate block being cast integrally with fins. Structures can be provided to engage with the base plate block, such as clamps or springs and for mounting of a supplemental fan to force air over the fins.

One technique for moving heat energy, which technique is very apt for compact or portable devices having digital processors or the like that generate substantial resistive heating, is to employ a heat pipe configuration to move heat energy from point to point. In a heat pipe arrangement, a captive heat transfer fluid typically is provided in closed thermally conductive envelope. The fluid circulates in a manner whereby heat is taken up at a point that is in thermal contact with the heat source, and the heat is released at a point in thermal contact with a heat sink.

The thermal path advantageously employs a cycle of phase changes of the heat transfer medium. The heat transfer medium is brought in a liquid phase to an evaporator. Heat from the circuit or other heat source boils or vaporizes the heat transfer medium at the evaporator. The resulting gaseous phase diffuses through the envelope and encounters a condenser associated with a heat sink. At the condenser, the gaseous phase is cooled and condenses back to a liquid. A return flow path re-circulates the condensed liquid phase back to the evaporator, closing the loop. In a heat pipe, capillary flow through a wicking material can provide the return flow path. The typical return flow path in the case of a thermo-siphon is gravity driven. Each phase change stores or releases a quantity of heat energy due to the latent thermal energy involved in the phase change itself.

Phase change heat exchange circuits as described can operate with a very modest temperature difference between the source (evaporator) and the sink (condenser) while moving heat energy. Nevertheless, it is a typical attribute of most heat pipe designs that a discrete area of the conductive envelope functions as the evaporator, and a different area that is more or less remote from the evaporator functions as the condenser. If the structure of the envelope is thermally conductive and the condenser part is very close to the evaporator part, then heat energy coupled into the envelope at the evaporator tends to heat the condenser by conduction through the material of the envelope.

The ultimate object of a heat dissipation structure is to couple heat energy from the area of the evaporator to that of the condenser. The use of a heat pipe with a phase change medium has the further object of maintaining the evaporator and condenser respectively above and below the vaporization temperature of the medium. In U.S. Pat. No. 6,163,073—Patel, an integrated heat sink and heat pipe are provided. The heat sink has a cast base plate and vertically extending fins, the fins being cast integrally with the base plate. The base plate has one or more elongated openings that extend along the bottom of the base plate, and either open downwardly toward the heat source or are just barely placed below the surface so as to minimize material between the opening and the heat source. Elongated heat pipes are disposed in the elongated openings, which are exclusively within the thickness of the base plate.

The '073 Patel patent explains that the area of the heat sink is much greater than the area of the heat source. This might suggest that the area in direct contact with the heat source functions as the evaporator, and areas that are remote from the heat source function as condensers. The patent teaches that this structure reduces thermal gradients in the heat sink. If in an ideal case there is no thermal gradient across the heat sink, then at that area in contact with the heat source, the temperature of the heat sink would be as low as possible, providing good coupling of thermal energy into the heat sink. That ideal case, however, presumably would not rely on a phase change between an evaporator and a condenser.

The Patel patent teaches alternative structures for the heat pipes that are placed along the side of the base plate that is to contact the heat source. In the embodiments wherein the openings on the underside of the baseplate are channels opening at the surface, the heat pipes can be D-shaped rather than round in cross-section, with the flat side facing the heat source. The channels are complementary, with U-shaped cross-sections, providing for full surface contact.

In a different sort of finned heat pipe arrangement, for example as shown in U.S. Pat. No. 5,329,993—Ettehedieh, the base plate part of a finned structure carries an array of passages that function as an evaporator, and these passages are coupled to standing hollow columns that are coupled to the passages in the base plate and function as condensers. An array of parallel (horizontal) fins is coupled to the standing (vertical) columns. This arrangement has structural advantages, but is complex.

It would be advantageous if thermal efficiency, mechanical complexity and production ease could be maximized in a finned heat pipe arrangement that is at the same time compact and inexpensive.

SUMMARY OF THE INVENTION

It is an object of the invention to provide a heat sink that does not rely on a base plate block to contribute to the structural or thermal attributes of the heat sink.

It is an object to structure the cross-sectional shape of a heat pipe so as to structurally engage complementary openings in a plurality of fins in a stack.

It is a further object to provide reinforced openings in heat exchange fins, which openings are easily manufactured, for fixing the relative positions of heat sink parts.

It is another object to adapt a heat pipe structure such that the fins and/or the heat pipe elements carry all necessary mounting hardware and provide a rigid and lightweight structure that is substantially entirely optimized for heat transfer functions.

These and other objects are accomplished by a heat sink for integrated circuits, which is limited substantially to a stack of heat transfer fins on a heat pipe tube. The heat pipe tube has a flattened oval cross-section and fits a complementary opening through the fins. A channel can be formed by aligned openings at the edge of the fins, exposing the heat pipe for direct contact with the heat generating circuit. The fins snap-fit with the tube and can have a collar to space the fins and/or extend the surface area of engagement. The air contact areas of the fins can be flat, or can comprise continuous folded or rolled form material wherein the variation from a flat shape provides greater total surface area per unit of outside dimensions (e.g., per unit of footprint area).

According to one aspect, the heat pipe can be snap fit in a channel running perpendicular to vertically oriented fins, along the bottom of the stack. In another embodiment, the upward legs of two U-shaped heat pipe tubes carry the stack. In that case, the bottoms of the U-shaped tubes are presented for contact with the circuit, under a stack of horizontal fins. A clamp urges the heat sink against the heat source.

A method for forming a heat transfer device is also provided including arranging a plurality of fins in a stack where the fins are formed with openings that substantially align with one another so as to define a die. A heat pipe comprising a thermally conductive envelope is driven into the die so as to deform the envelope. In this way, at least one flattened surface is formed in the envelope while the outside shape of the thermally conductive envelope is complementary with openings. As a result, the fins are supported upon the thermally conductive envelope, which substantially defines a mounting base for the heat transfer device. The flattened surface of the heat pipe is attachable to a heat source for thermal energy exchange with said heat source.

The structure is inexpensively built from the minimum necessary parts and provides advantages including compact size, light weight, good thermal efficiency, low thermal inertia and low cost.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENTS

Figure 1:
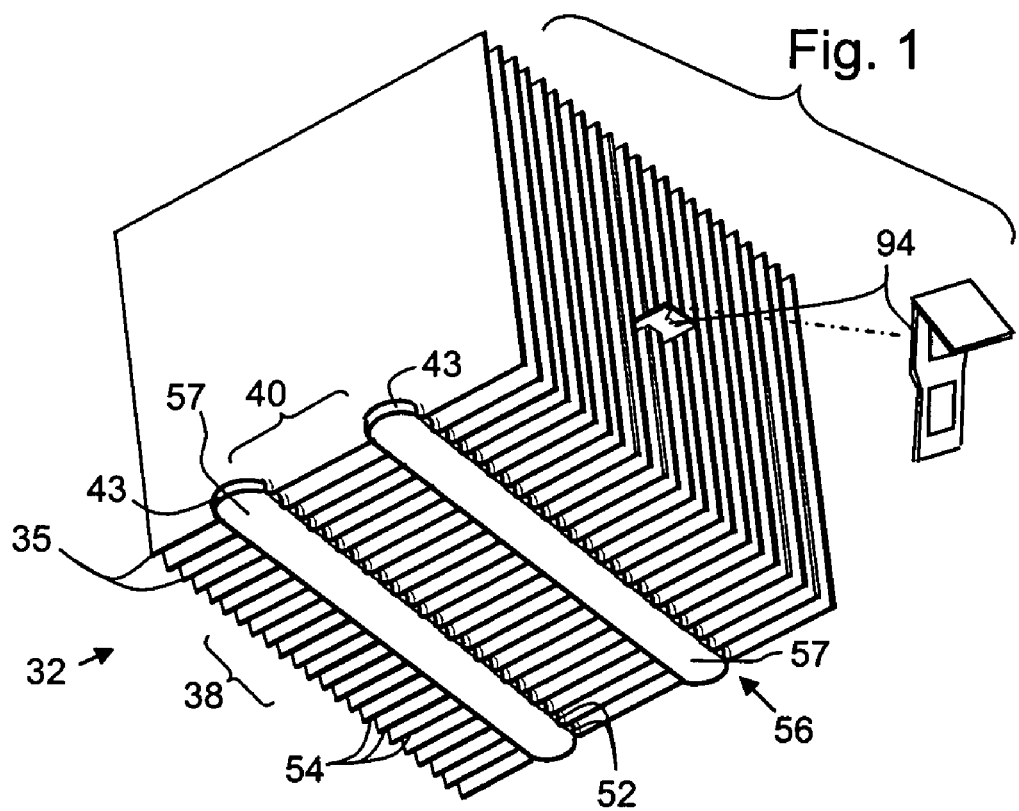
FIG. 1 is a perspective view of a heat dissipation unit with direct contact heat pipe according to the invention, the bottom part in the orientation shown being the side to be directed against a circuit device to be cooled.

This description of preferred embodiments is to be read in connection with the accompanying drawings, together forming the description of the invention and illustrating certain non-limiting examples. The drawing figures are not necessarily to scale and represent some features in schematic form, in the interest of clarity and conciseness.

The invention provides a heat transfer device 32 for dissipating heat developed by a source such as an integrated circuit package. The device takes up heat energy by conduction with the source, and dissipates the heat by convection and radiant cooling, into the surrounding air. It is an aspect of the invention that the thermal energy pathways are as direct as practicable, and the structure of the device is substantially limited to those elements that are directly related to engaging the heat transfer device with the source and to dissipating the heat that the device collects.

An exemplary embodiment of the heat transfer device is shown in FIG. 1. A plurality of fins 35, spaced from one another and arranged in a stack 38, are provided for heat exchange with the ambient air. A heat pipe structure 40 is thermally coupled to the fins 35, and has at least one thermally conductive envelope 43. The envelope 43 contains a working fluid for distributing heat energy.

In FIG. 1, the heat transfer device 32 is shown from below and from one end, the point of view being based on the assumption that the heat transfer device 32 preferably is arranged to reside vertically over the heat source (not shown in FIG. 1) so as to take advantage of convection in order to circulate the air around the heat transfer fins 35. This orientation is efficient in the absence of a forced air current, but is not required to achieve many of the benefits of the invention.

Generally, any spatial and similarly relative terms used in this description, whether denoting an overall orientation such as "horizontal," "vertical," "up," "down," "top" and "bottom" or their derivatives (e.g., "horizontally," "downwardly," "upwardly," etc.) are intended to refer merely to the orientation of the item then being described and shown in the drawing under discussion. Such spatial and relative terms are used for convenience of description and should not be construed to require a particular orientation in any other context. The same considerations apply to internally relative terms such as "inwardly" versus "outwardly," "longitudinal" versus "lateral" and the like, which are to be interpreted relative to one another or relative to an axis of elongation, rotation, assembly or the like, as appropriate to the description at that point.

Terms stating or implying relationships of attachment or coupling, whether mechanical or thermal or otherwise, refer to a relationship wherein the structures can be attached, coupled, connected (etc.) directly or indirectly through intervening structures that may contribute to such attachment or coupling. Attachments, couplings and the like also can be movable or rigid, continuous or intermittent, etc., unless otherwise required according to the context of these particular terms. Where elements are "operatively" connected, attached, or coupled, that connection, attachment or coupling is intended to denote a connection or the like that allows the pertinent structures to operate as stated, generally but not necessarily by virtue of such relationship.

Referring again to the view in FIG. 1, the embodiment shown has a heat pipe structure 40 comprising two heat pipe tubes 43 that are elongated in a direction perpendicular to the parallel spaced planes of a number of heat transfer fins 35. The fins 35 each comprise a rectangular thin sheet metal plate, which is formed to engage mechanically and thermally with the heat pipe tube 43. The fins 35 are shown as flat plates in this embodiment, but could be formed with more surface area per unit of outside area, for example using a continuous folded, sinusoidal or similarly corrugated form, or by rolling, stamping or otherwise embossing a pattern in the plates, such as an array of bumps, ridges or the like. Forming irregularities in the shape in this way is advantageous for providing a high ratio of surface area to volume. Irregularities also produce local air flow eddies. But an irregular shape has a greater resistance to air flow parallel to its surface than a smooth shape.

According to an inventive aspect, one or more thermally conductive envelopes or heat pipe tubes 43 of the heat pipe structure 40 substantially define the mounting base for the heat transfer device 32. Thus there is little structure needed other than the fins 35, which are shaped to engage and deform a portion of heat pipe tubes 43. The heat pipe tubes 43 themselves provide a supporting structure for the stack of parallel fins 35.

The heat pipe tubes or envelopes 43 are attachable to a heat source (shown in FIGS. 3 and 5) for thermal energy exchange by conduction with the heat source through direct contact. The heat pipe tubes 43 are also in contact with the air contacting fins 35. Thus, any heat energy coupled into the heat pipe tubes 43 is in turn coupled into the fins 35 and is dissipated into the ambient air by convection and/or forced air cooling.

Figure 2:
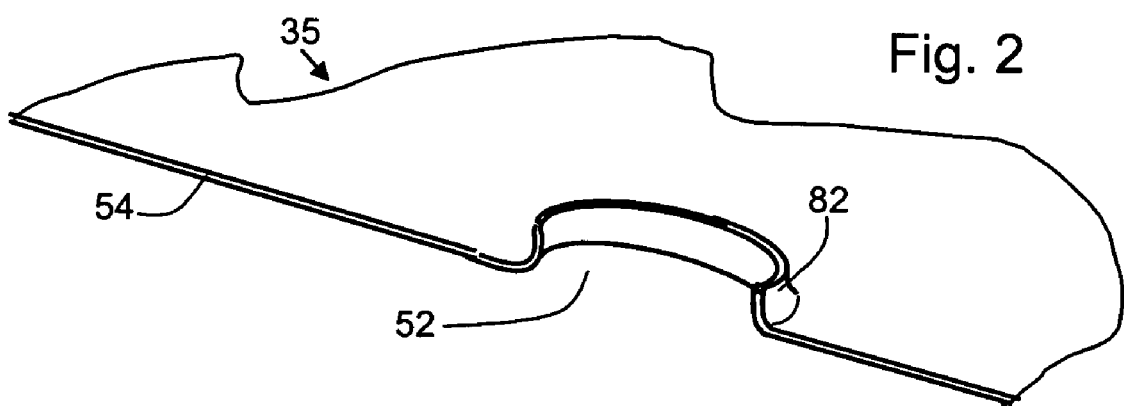
FIG. 2 is a partial perspective view showing a detail of the fin structure at one of the openings that are aligned in FIG. 1 to form a channel for a heat pipe tube.

In addition to coupling thermal energy to the fins 35, the heat pipe tubes 43 mechanically support the fins. As shown in FIGS. 1 and 2, the fins 35 have formed openings 52 that, in this embodiment, are arranged along the extreme edges 54 of the fins 35. The fins 35 in the stack 38 are substantially aligned, the openings 52 in successive fins 35 forming a channel 56 that acts as a die to plastically deform the conductive envelope or heat pipe tube 43 when the tube is driven into channel 56 (FIGS. 6-9).

Two heat pipe tubes 43 are shown in FIG. 1. Each of the tubes is engaged in corresponding openings 52 in the stacked fins 35, an exemplary opening being shown in FIG. 2. The stack of fins 35 is supported in registry by elastic, resilient engagement with the heat pipe tube or tubes 43. The fins 35 in this embodiment are formed with openings 52 in a shape that becomes at least slightly wider proceeding inwardly from the extreme edge 54 of the fins 35. The tubes 43 begin with a substantially circular cross-sectional shape, but as they are driven into channel 56 by an anvil 55, they are deformed by the plurality of fins 35 along the edges that define channel 56. In this way since channel 56 acts as a die, tubes 43 are plastically deformed so as to comprise a shape that is complementary to the shape of channel 56. As a result of this forming operation, a flat face 57 is formed on the outwardly facing surface of each tube 43. The heat pipe tubes 43 present flat face 57 outwardly (downwardly in FIG. 1) substantially along the aligned edges of the fins 35. Flat face 57 is engaged in surface contact with the heat source (not shown in FIG. 1).

Figure 4:
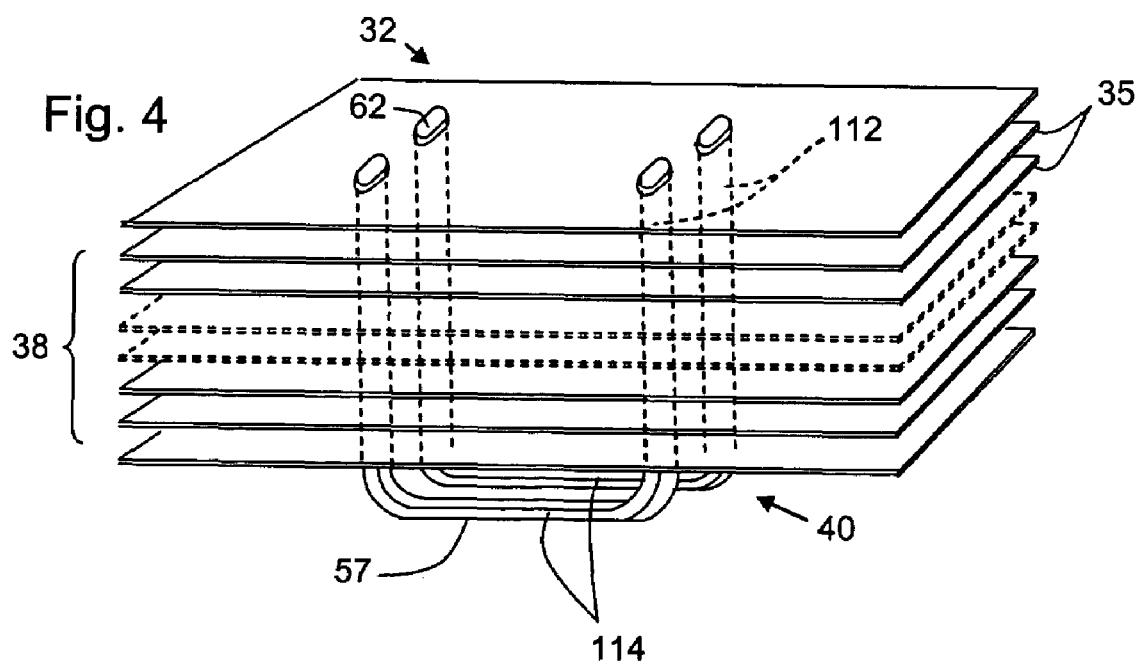
FIG. 4 is a perspective illustration showing an alternative embodiment wherein the section of the heat pipe arranged for direct contact with the heat source is a flat segment at the bottom of a squared U-shape configuration of one form of dual heat pipe for use with the invention.

It is also possible to provide an arrangement in which the heat pipe tubes or thermally conductive envelopes are snap fitted into the edge of the stack 38 as shown in FIG. 1. Also, tubes 43 may be inserted endwise through openings that are spaced from the edges of the fins 35. Such an embodiment is shown in FIG. 4 and is discussed below.

In order to achieve a snap fit and to present the flat face 57 toward the heat source, the heat pipe tubes 43 may be performed to have a particular cross-sectional shape characterized by a decreasing width, proceeding toward the edge 54 of the fins 35. The openings 52 in the fins 35 also have a complementary shape, namely with a decreasing span of the openings along the edges or the fins. As a result, when the fins 35 are fitted to the tubes 43 by pressing the tubes 43 into the channels 56 defined by the openings 52 in a stack of fins (or vise versa) the two snap together. The part of the fins at the minimum span of the opening, and/or tubes at the point of increasing width, interfere and are resiliently deformed. As these interfering parts pass, they snap back to their rest position and hold the fins and the tubes in substantially rigid mechanical attachment.

Figure 3:
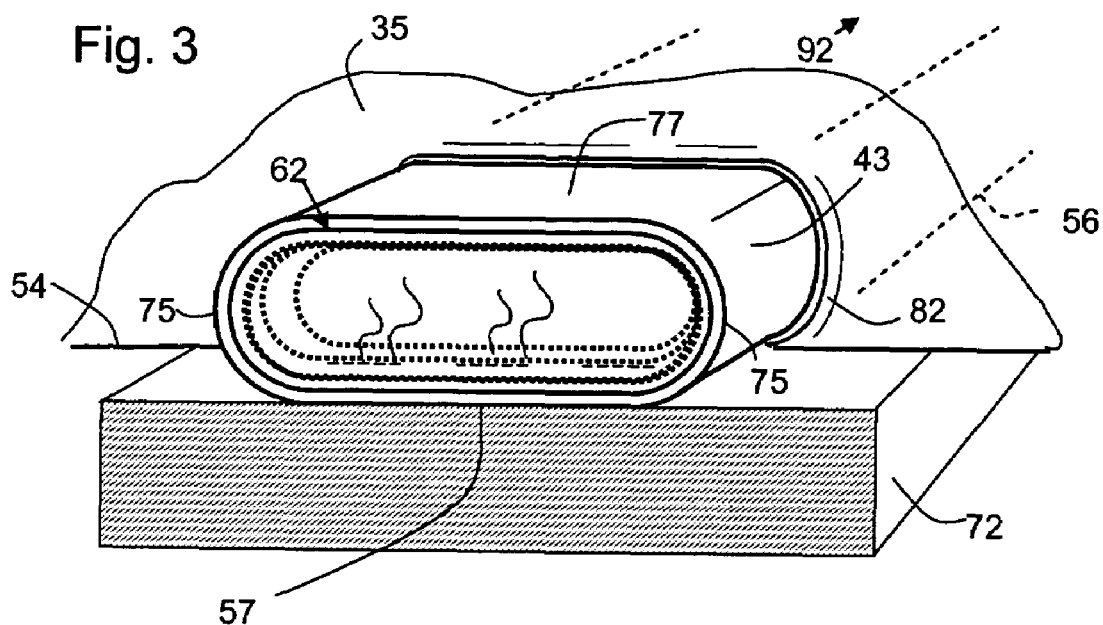
FIG. 3 is a partial perspective view illustrating the relationship of the heat source, heat pipe and fins of the heat dissipation unit.

A preferred shape for achieving this snap fitting is the flattened oval or lozenge shaped cross-section 62 of the heat pipe tube 43, shown in FIG. 3. The tube 43 has a relatively wide and flat face 57 presented toward the heat source 72, namely downwardly in FIG. 3. The two lateral sides 75 of the tube are rounded and in this embodiment lead to a symmetrically flat opposite face 77 on the top side of the tube 43. The opposite face 77 need not be flat. The lozenge or flattened oval cross-section 62 has a relatively narrower width at the tangent between the flat outer-face 57 and the curve on the lateral sides 75, and a relatively greater width at the outside peak of the rounded lateral sides 75. The openings 52 in the fins are complementary with the flattened oval 62 at least to the extent that the span between the sides of the channel formed by openings 52 extends beyond and is narrower than the maximum width of the tube 43 between the peaks of the rounded lateral sides 75. That is, the openings in the fins 35 are at least somewhat narrower at the extreme edge 54 of the fins 35 than they are at a point spaced inwardly from the edge 54, corresponding to the peak between the rounded ends 75.

The foregoing structure enables the fins 35 to be snap-fitted to the heat pipe tubes 43 or vice versa. The openings 52 in the fins could be cut from flat stock, i.e., with the fins 35 shaped simply as flat sheets with voids or cutouts 52 complementary with the flattened oval heat pipes 43 opening at the edge 54. According to another aspect, the openings 52 at the edges of the fins 35 are formed, for example in a stamping procedure, to provide a formed collar 82 in the flat sheet material, raised from the plane of the sheet material around at least part of the opening 52 and thus encompassing a length along the channel 56 for the heat pipe tube 43, which length is greater than the thickness of the sheet material.

An exemplary formed collar 82 on a fin 35 is shown in FIG. 2. The collar can be more or less continuous around the heat pipe tube opening, but at least in the area of the heat source, the heat pipe tube 43 is exposed for direct contact with the source for good thermal transfer efficiency. Therefore at least in this area the opening for the heat pipe tube crosses over the edge of the fin.

The heat pipe tubes may be longer than the corresponding dimension of the heat source, causing the ends of the tubes 43 to extend beyond the end of the heat source. In that case it not necessary for the heat pipe tubes to be exposed for contact and it is efficient for heat transfer purposes for the openings in the fins to be spaced back from the edge 54 of the fin plate. This could involve making the fins 35 vertically shorter where the heat pipe tubes 43 are exposed, such as at a midpoint between the ends, and longer at the ends. The heat pipe tubes 43 also need not be straight and could extend in an upward incline toward the ends of the tubes (not shown). Depending on the orientation of the fins, the heat pipe tubes also can follow a right angle bend, shown in FIG. 4.

Figure 5:
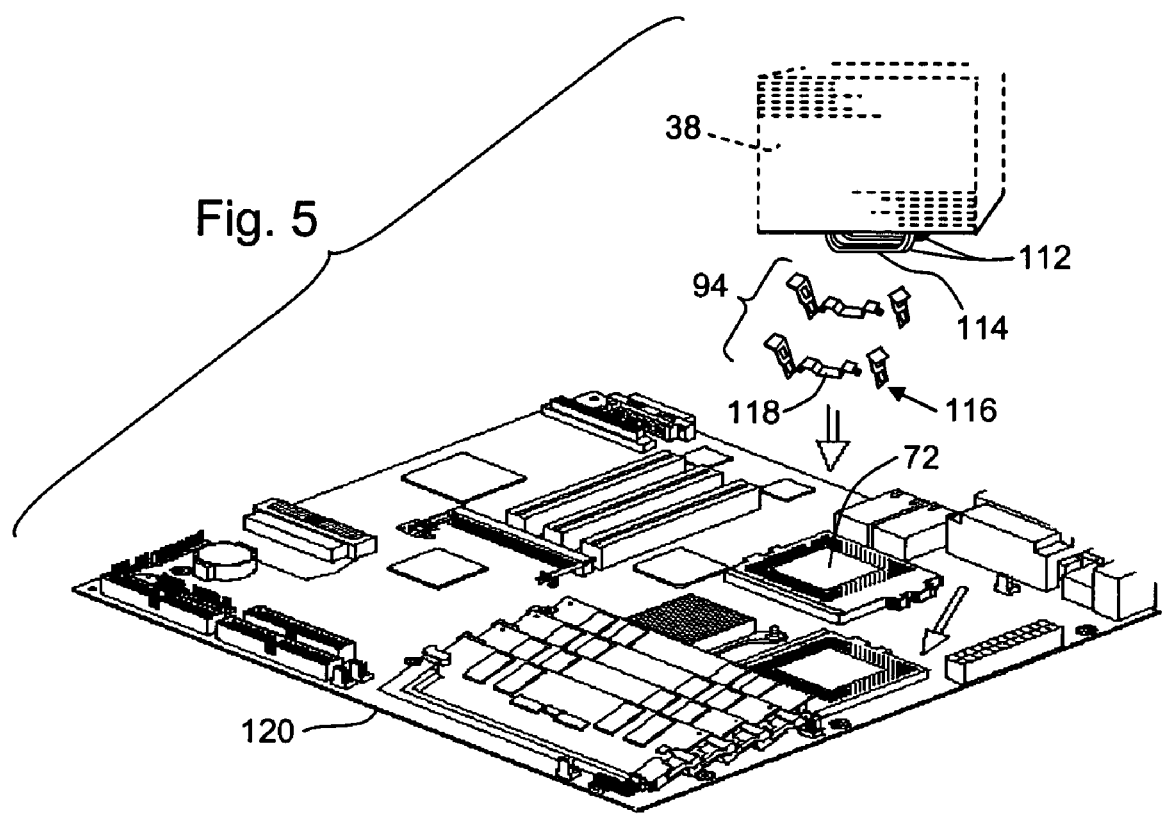
FIG. 5 is an elevation view showing mounting of the heat dissipation unit of FIG. 4 using spring clips.

Each heat pipe 43 serves to distribute heat energy coupled to the heat pipe from the heat source, such as an integrated circuit package 72, shown in FIGS. 3 and 5. The heat source couples heat to the heat pipe 43 at a relatively concentrated area that is in direct contact with the source and functions as an evaporator. The heat pipe conductively and by thermal phase change conveys that heat energy, to the remainder of the heat pipe and distributes the heat energy to the fins 35. In a preferred arrangement, the heat pipe vessel comprises a highly thermally conductive material, normally a metal. Silver, gold, copper, aluminum, titanium or their alloys are useful, with some tradeoff being made for thermal conductivity versus expense. It should be understood that when tubes 43 are to be plastically deformed by channel 56, a ductile metal will be a preferred material choice. Polymeric materials can also be used, including materials known in the electronics industry for heat transfer applications, such as thermoplastics (crystalline or non-crystalline, cross-linked or non-cross-linked), thermosetting resins, elastomers or blends or composites thereof that are characterized by thermal conductivity.

The working thermal transfer fluid can be selected from a variety of well known two phase fluids depending upon expected operational conditions such as the operating temperature range over which the heat transfer device will operate. Appropriate fluids may include, for example, one or more of water, Freon, ammonia, acetone, methanol, ethanol and the like. The prime requirements for a suitable working fluid are compatibility with the materials forming wick and the envelope wall, good thermal stability, ease of wetting of the wick and wall materials as well as viscosity and surface tension attributes suitable for capillary flow.

Referring to FIG. 3, the thermally conductive tube 43 is provided with a wicking material along its inner surfaces, such as a granular form of a similarly thermally conductive material as compared to the material of the tube, bonded adhesively or sintered so as to provide a porous mass with capillary sized passages. The tube is charged with a thermal working fluid and partially evacuated. Thermal energy transfer occurs conductively through the material of the tube, but importantly, the area of the tube that is in the most intimate contact with the heat source 72, namely the flat face 57 of the flattened oval shape 63 in FIG. 3 that functions as the supporting base surface of the device, reaches a slightly higher temperature than other portions of the tube 43, such as portions that are more closely coupled to the fins 35 than the heat source 72 and/or are more remote from the concentrated heat energy at the heat source, such as ends of the tubes 43 that may extend beyond the edges of the heat source 72.

The area 57 of the tube in contact with the heat source 72 functions as an evaporator at which the working fluid is vaporized. The working fluid diffuses in the gaseous phase throughout the tube. At areas where the inside surfaces of the tube are slightly cooler, even by a relatively small temperature difference, the gaseous working fluid condenses. In the process of condensing, the fluid transfers the latent energy of its vaporization to warm the heat pipe tube 43 at that slightly cooler area, which functions as a condenser. The working fluid in the liquid phase flows back again by capillary action of the wicking material and is again vaporized in a continuing cycle. Capillary flow in wicking material provides a returning liquid phase flow path that does not rely on gravity (although gravity may contribute to the flow in certain orientations).

The overall effect is to reduce the concentration of elevated temperature that would otherwise be maintained at the heat source 72. The temperature at portions of the heat pipe 43 that are remote from the heat source, such as the far ends 92 of the heat pipe, is elevated. Heat energy is moved from the source and coupled into the fins 35. The fins in turn transfer the heat energy into the surrounding air, which is moved by convection or optional forced air circulation. This moves the heat finally away from the heat sink and away from source 72. The heat dissipation unit as described couples heat energy to the fins at least as efficiently as a comparable heat sink that relies only on conduction from a base block to a similar array of fins, and normally is more efficient due to the relative lack of concentration of heat near the source in the heat pipe arrangement of the invention, and/or due to the relatively elevated temperature difference between remote areas on the fins and the surrounding air, compared to a simple thermal conduction finned heat sink.

As noted above, the fins preferably are formed with collars 82 that extend for a short distance longitudinally along the heat pipe tubes 43. The longitudinal dimension of the collar and the relative span of the opening versus the width of the heat pipe tube are subject to variations, provided that there is sufficient clearance to snap the parts together, preferably snugly so that the assembly is substantially rigid as snapped together and the fins are operatively engaged in thermally conductive contact with the heat pipe tubes.

The longitudinal extension of the collars 82 increases the surface area of contact between the heat pipe tubes and the fins, as compared to a strictly planar sheet metal fin, which is helpful for thermal transfer efficiency. The longitudinal extension of the collars 82 also improves the rigidity of the mechanical connection of the fins 35 to the heat pipe tubes 43. Thus the heat pipe tubes 43 provide a secure base for a rigid structure comprising the fins and the heat pipe tubes.

The formed collars 82 of the fin openings 52 can be axially or longitudinally high enough to space at least certain of the fins from the next adjacent fin. In the embodiment shown, the collars do not extend longitudinally on the heat pipe tubes 43 all the way to the next adjacent fin. The fins can be formed such that the collars do not all face in the same direction for end-to-end abutment of the collars. In an embodiment as shown wherein two heat pipe tubes are provided, the collars for one tube can be oriented in the opposite direction from the collars for the other tube, further contributing to rigidity of the assembly.

Figure 6:
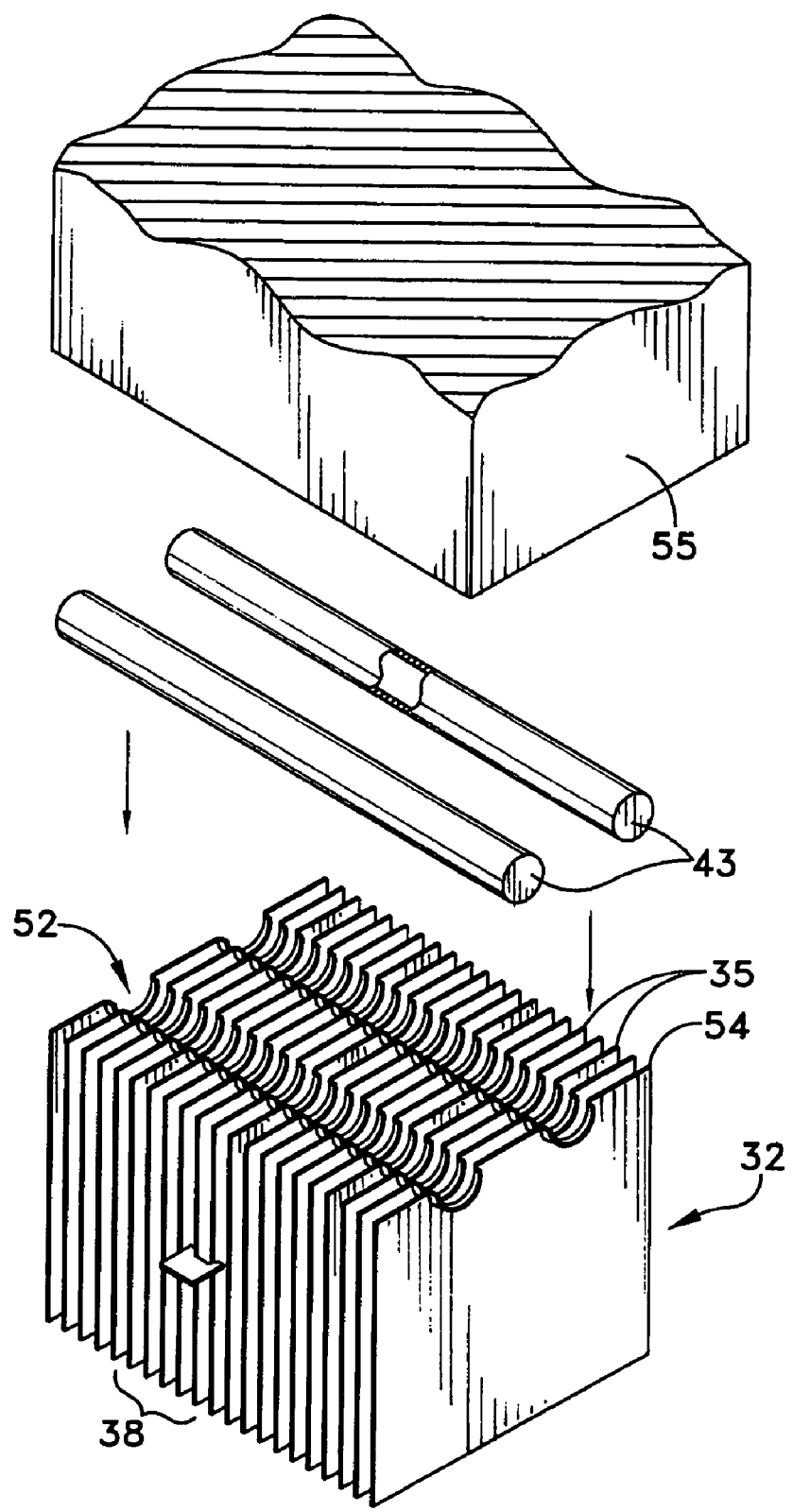
FIG. 6 is an exploded perspective view of a heat transfer device, a pair of heat pipes, and an anvil arranged so as to allow for the practice of a method according to the invention.
Figures 7, 8:
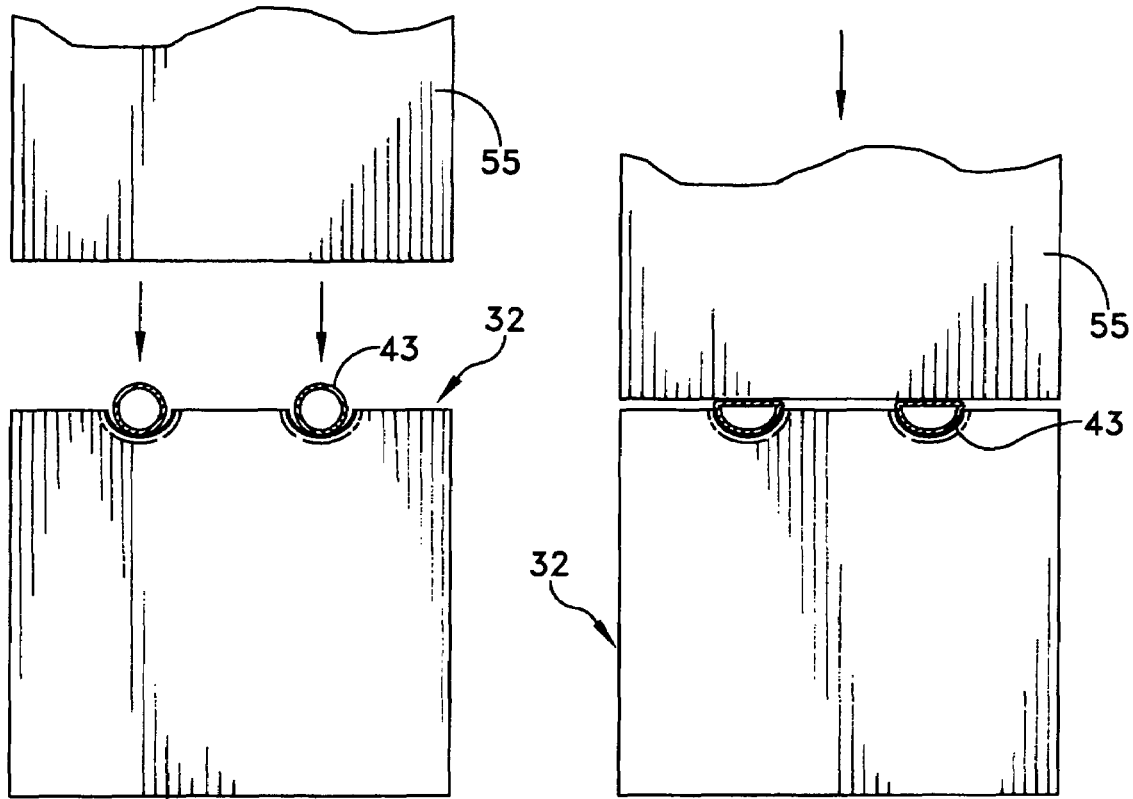
FIGS. 7-9 are side elevational views of the apparatus illustrated in FIG. 6, showing the progressive steps associated with the method of the invention.
Figure 9:
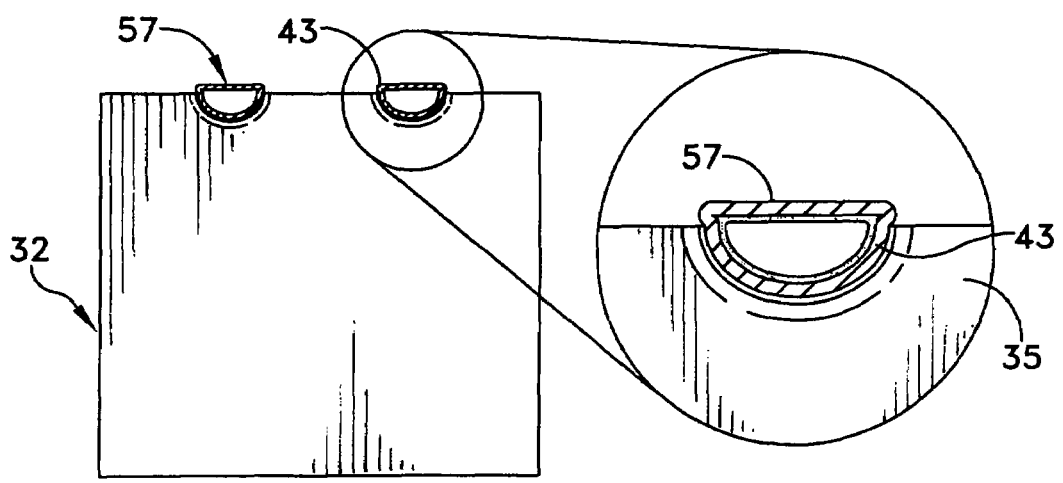

The heat pipe tubes 43 provide in one structure both the mechanical base on which the fins are mounted in a rigid assembly, and a primary pathway in a thermal energy transfer path from the source 72 to the fins 35. In FIGS. 1-3, the openings 52 in the fins 35 open at an outside edge 54 of the stack 38 and are aligned to define a channel 56 for the heat pipe tube 43. As already described, the channel is characterized by a reduction in channel width or span approaching the outside edge 54 of the associated fin 35, and an increase in width or span proceeding inboard away from the edge 54 of the fin. In one embodiment of the invention, the shape of the opening and the inside surface of collar 82 are at least partly complementary to the shape of the heat pipe tube 43, and preferably are substantially form fitting for maximum surface contact. Providing that the difference in width from the widest to the narrowest point is in the range of resilient deformation of the tube 43 and fins 35, respectively, the heat pipe or conductive envelope is snap-fittable into the channel 56 for structurally supporting the fins and providing a thermal contact heat transfer pathway. In an embodiment of the invention where tube 43 is plastically deformed by channel 56, tube 43 is substantially cylindrical prior to insertion into channel 56 (FIGS. 6-7).

The conductive envelope (heat pipe) has a flattened surface 57 facing outwardly from the channel 56 and as shown in FIGS. 1-3, the flat face or surface 57 is presented as the outermost surface of the heat dissipation unit, which is a rectilinear block in this example. Flattened surface 57 may be preformed on tube 43 (FIGS. 1-4) or may be formed as a result of plastic deformation caused by driving a cylindrical tube 43 into channel 56. All that remains is to mount the heat dissipation unit with surface 57 in thermal contact with the heat source 72. This embodiment has two discrete heat pipe tubes 43, both with an oval cross-section having a flattened surface at least on a side facing outwardly from the channel 56. The flat faces of the two heat pipes are coplanar as shown. They could be placed at different levels in an embodiment having a heat source that was other than a flat package, or to dissipate heat from two sources at different elevations relative to the stack, using the same array of fins.

It is possible to provide more than the two heat pipe tubes shown. The tubes can be relatively larger width individual tubes, or more numerous relatively smaller width tubes. Finite element heat transfer analysis software can be used to model the heat transfer characteristics of the unit in transient and steady state conditions, to optimize the relative sizes of the parts in view of the expected heat load, operating temperature differences and temperature ranges, air flow and material thermal conductivities.

In the example, the fins 35 are substantially planar sheets but for a formed collar, raised around at least part of the channel 56. It is possible to provide greater fin surface area in a given volume by providing a rippled sheet configuration with folds, corrugations, rolled or embossed irregularities, etc. On the other hand, a smooth and flat configuration presents less resistance to air flow passing over the surface of the fins.

An objective of the configuration shown in FIG. 1 is substantially to limit the structure of the unit to the bare elements that are needed to provide a unitary structure with the necessary thermal energy transfer effects, thus achieving cooling in an optimally compact, light weight and minimally expensive heat sink unit. However one necessary function is to mount the heat sink unit in contact with the circuit package or similar heat source 72. FIG. 1 illustrates the attachment of a spring clip and receptacle 94 to the stack 38 of fins 35. The spring receptacle in this embodiment is placed on the fin stack instead of the heat pipe tubes 43 that ultimately need to be clamped against the heat source, partly because tubes 43 are relatively inaccessible under the stack 38. However this arrangement works very well, because by clamping the heat pipe tubes by force applied between the fins and the mounting for the circuit package (not shown in FIG. 1), the rigidity of the assembly is further improved. The resilience of the clip in this embodiment also presses the fins 35 against the heat transfer pipes 43, however it is preferable if the connection of the fins to the heat pipes is relatively close even without exertion of pressure. The intimacy of the connection between the fins and the heat pipes can also be improved by soldering or adhesively affixing the fins and the heat pipe tubes.

Various clamping fixtures are possible. The depicted fixture is affixed to the fins 35 at a space from the conductive envelope or heat pipe 43. The clamping fixture provides a point for attachment in clamping the heat transfer device to a heat source, i.e., a mechanical mounting, while also resiliently clamping the heat pipe 43 into thermally conductive contact with the heat source 72.

In FIGS. 1-3, the stack of fins is supported substantially exclusively by the conductive envelope (heat pipe tube) 43 and the clamping fixture. The heat sink or heat dissipation unit shown consists essentially of a plurality of planar fins 35 spaced from one another in a stack 38, at least one heat pipe tube 43 extending through the stack, two being shown, and a clamping fixture 94 to be affixed between the fins and the circuit package to be cooled. The fins 35 have aligned openings 52 that are complementary with an outside size and shape of the heat pipe tube 43, for structurally attaching the fins and the heat pipe tube. The clamping fixture 94 can be affixed to one or the other or both of the fins 35 and the heat pipe tube(s) 43, the mounting fixture being operable to hold the heat sink such that the heat pipe tube is urged against the flat surface of the circuit package.

FIGS. 4 and 5 show an embodiment wherein channels formed by aligned openings in the fins are spaced inwardly from the edge of the stack and the evaporator area along the heat pipe tubes 43 extends parallel to the planes of the fins. The fins in this stack are oriented parallel to the plane of contact with the circuit package, rather than perpendicular to that plane as in FIGS. 1-3. In this arrangement, the heat pipe tubes or envelopes 112 are flattened ovals as described above, presenting a flat side 57 for contact with the circuit package. The heat pipe tubes 112 (two being shown) are U-shaped, the bottom of the U-shape forming a flat bottom section 114. The flat bottom part of the U-shape also has the flattened oval or lozenge cross-sectional shape as discussed, presenting two flat areas on the two tubes, including the flat bottom section 57 wherein the heat pipe tubes form a structural base for the circuit package in a manner similar to that described above. In this case, clamping is accomplished by one or more separate resilient clamping fixtures 116, each having a bow part 118 that clamps over the bottom sections of the heat pipe tubes and clasps that affix to the circuit card for holding the unit in place. As in the previous embodiment the clamping fixture engages with corresponding elements on the circuit board 120, typically mounted to the sides of the receptacle for the processor unit, display driver, memory or similar circuit element to be cooled.

An advantage of these embodiments of the invention is that no base plate block is required or included. The support and thermal contact functions of a baseplate block are met directly by the heat pipe tubes 43 or 112 that also distribute and move the thermal energy away from the source. This is efficient in terms of heat transfer efficiency, is compact and lightweight, and is relatively inexpensive to manufacture.

The invention is versatile and applicable to fin or heat pipe tube arrangements of various types and oriented in various ways. The flattened oval heat pipe tube provides a useful evaporator surface in the area of the heat source, and also provides useful condensing and return flow structures elsewhere in the tube. The tube can be a straight line spine for the fins or a more complicated tower arrangement with plural U-shaped or similarly configured sections.

It is to be understood that the invention is not limited only to the particular constructions herein disclosed and shown in the drawings, but also encompasses modifications or equivalents within the scope of the appended claims.

What is claimed is:

1. A method for forming a heat transfer device for dissipating heat comprising the steps of:
arranging a plurality of fins that are formed with openings that substantially align with one another so as to define a die;
forming a collar raised around at least part of each of said openings;
driving a heat pipe into said die so as to deform the heat pipe thereby forming at least one flattened surface and wherein an outside shape of the heat pipe is complementary with said openings; and
supporting said fins upon the heat pipe such that the heat pipe substantially defines a mounting base for said heat transfer device, and is attachable to a heat source for thermal energy exchange with said heat source.

2. The method of claim 1 wherein forming a collar raised around at least part of each of said openings occurs prior to driving the heat pipe.

3. The method according to claim 1 wherein said fins are substantially exclusively supported by said at least one heat pipe.

4. The method of claim 1 including changing said outside shape of said heat pipe by driving the heat pipe on a forming surface defined by said plurality of fins.

5. The method of claim 1 wherein arranging a plurality of fins includes forming a stack of spaced-apart fins.

6. The method of claim 1 including forming the fins from substantially parallel flat sheets.

7. The method of claim 1 including deforming the heat pipe by contact with the fins.

8. The method of claim 1 including aligning the openings in the fins to define a channel, and wherein the channel has a reduction in channel width for at least partially defining the outside shape of the heat pipe.

9. The method of claim 1 including forming the heat pipe to define an oval cross-section having a flattened surface on at least one side.

* * * * *